United States Patent
Nakahata

(10) Patent No.: US 7,534,295 B2
(45) Date of Patent: May 19, 2009

(54) III NITRIDE SINGLE CRYSTAL MANUFACTURING METHOD

(75) Inventor: Seiji Nakahata, Itami (JP)

(73) Assignee: Sumitomo Electric Industries, Ltd, Osaka (JP)

( * ) Notice: Subject to any disclaimer, the term of this patent is extended or adjusted under 35 U.S.C. 154(b) by 448 days.

(21) Appl. No.: 10/569,813

(22) PCT Filed: Jul. 13, 2005

(86) PCT No.: PCT/JP2005/012886

§ 371 (c)(1), (2), (4) Date: Feb. 16, 2006

(87) PCT Pub. No.: WO2006/011361

PCT Pub. Date: Feb. 2, 2006

(65) Prior Publication Data

US 2008/0169532 A1    Jul. 17, 2008

(30) Foreign Application Priority Data

Jul. 27, 2004  (JP)  ............... 2004-218663

(51) Int. Cl.
C30B 7/00 (2006.01)
H01L 21/36 (2006.01)

(52) U.S. Cl. ........................ 117/35; 438/478

(58) Field of Classification Search .......... 117/35; 438/478
See application file for complete search history.

(56) References Cited

U.S. PATENT DOCUMENTS 6,172,382 B1 * 1/2001 Nagahama et al. ............ 257/94

FOREIGN PATENT DOCUMENTS

| JP | 2001-058900 A | 3/2001 |
|---|---|---|
| JP | 2002-047100 A | 2/2002 |
| JP | 2004-189549 A | 7/2004 |
| JP | 2004-277224 A | 10/2004 |
| WO | WO-02/099169 A1 | 12/2002 |

OTHER PUBLICATIONS

M. Aoki, et al., "Conditions for Seeded Growth of GaN Crystals by the Na Flux Method," Materials Letters, 2002, vol. 56, pp. 660-664.
H. Yamane, et al., "GaN Single Crystal Growth by the Flux Method," Applied Physics 2002, vol. 71, No. 5, pp. 548-552.

(Continued)

Primary Examiner—Evan Pert
(74) Attorney, Agent, or Firm—James W. Judge

(57) ABSTRACT

A III nitride single-crystal manufacturing method in which a liquid layer (3) of 200 μm or less thickness is formed in between a substrate (1) and a III nitride source-material baseplate (2), and III nitride single crystal (4) is grown onto the face (1s) on the liquid-layer side of the substrate (1). Herein, the substrate (1) in at least a superficial layer (1a) on the liquid-layer side may be formed of a III nitride single crystal, while the III nitride source-material baseplate (2) can be formed of a III nitride polycrystal. Further, the substrate (1) in at least a superficial layer (1a) on the liquid-layer side, and the III nitride source-material baseplate (2) can be formed of a III nitride single crystal, while the face (1s) on the liquid-layer side of the substrate (1) can be made a III-atom surface, and the face (2s) on the liquid-layer side of the III nitride source-material baseplate (2) can be made a nitrogen-atom surface.

4 Claims, 4 Drawing Sheets

OTHER PUBLICATIONS

S. Dhar, et al., "Observation of a 0.7 eV Electron Trap in Dilute GaAsN Layers Grown by Liquid Phase Epitaxy," Applied Physics Letters, Aug. 9, 2004, vol. 85, No. 6, pp. 964-966.

H. Morkoc, "Comprehensive Characterization of Hydride VPE Grown GaN Layers and Templates," Materials Science and Engineering, R33, 2001, pp. 135-207.

* cited by examiner

III NITRIDE SINGLE CRYSTAL MANUFACTURING METHOD

TECHNICAL FIELD

The present invention relates to methods of manufacturing Group III nitride single crystals utilized in semiconductor devices such as light-emitting diodes, electronic circuit elements, and semiconductor sensors. In particular the invention relates to a method of manufacturing III nitride single crystals efficiently and at favorable yields.

BACKGROUND ART

III nitride single crystals have extraordinary utility as materials to create substrates for light-emitting diodes, electronic circuit elements, and semiconductor sensors.

To date, III nitride single crystals for such applications have been grown by vapor-phase techniques such as hydride vapor-phase epitaxy (HVPE) or metalorganic chemical vapor deposition (MOCVD)—for example, reference is made to Non-Patent Document 1—as well as by liquid-phase techniques such as high nitrogen pressure growth or the flux method—for example, reference is made to Patent Document 1 and Non-Patent Document 2.

With vapor-phase techniques such as HVPE and MOCVD, however, inasmuch as the source materials for the III nitride single crystals (that is, Group III elements and nitrogen) are transported in the gas phase, the source-material yield is on the order of an extremely low 1%.

On the other hand, with liquid-phase techniques such as high nitrogen pressure growth or the flux method, the fact that the amount of nitrogen that dissolves into a liquid phase is extremely low leads to extremely low III-nitride monocrystalline growth rates.

With regard to the growth of SiC single crystal, meanwhile, growing SiC single crystal at high crystallization speeds by stacking together a monocrystalline SiC substrate and a polycrystalline SiC plate, with a molten Si layer intervening, has been proposed—for example, reference is made to Patent Document 2. Nevertheless, in growing SiC single crystal, transporting carbon atoms in the solid phase is a challenge, whereas in growing III nitride single crystals, the difference is that transporting nitrogen atoms in the gas phase is a challenge.

Patent Document 1: Japanese Unexamined Pat. App. Pub. No. 2001-58900.

Patent Document 2: Japanese Unexamined Pat. App. Pub. No. 2002-47100.

Non-Patent Document 1: H. Morkoc, "Comprehensive Characterization of Hydride VPE Grown GaN Layers and Templates," *Materials Science and Engineering*, R33, 2001, pp. 135-207.

Non-Patent Document 2: H. Yamane et al., "GaN Single Crystal Growth by the Flux Method," *Applied Physics*, The Japan Society of Applied Physics, 2002, Vol. 71, No. 5, pp. 548-552.

DISCLOSURE OF INVENTION

Problems to be Solved by the Invention

An object of the present invention is to make available a III nitride single-crystal manufacturing method whereby yields from the source materials are high and the crystal growth rate is advanced. This means that in order to manufacture III nitride single crystal at high yield and an advanced crystal growth rate, the problem becomes how to transport the Group-III element atoms and the nitrogen atoms efficiently.

Means to Solve the Problem

The present invention is a method of manufacturing III nitride single crystal, in which a liquid layer 200 μm or less in thickness is formed in between a substrate and a III nitride source-material baseplate, and III nitride single crystal is grown onto the face of the substrate on its liquid-layer side.

In a III nitride single-crystal manufacturing method involving the present invention, the substrate in at least a superficial layer along the liquid layer can be formed of a III nitride single crystal, while the III nitride source-material baseplate can be formed of a III nitride polycrystal.

In a III nitride single-crystal manufacturing method further involving the present invention, the substrate in at least a superficial layer along the liquid layer, and the III nitride source-material baseplate can be formed of a III nitride single crystal, while the face of the substrate on its liquid-layer side can be made a Group-III-atom surface, and the face of the III nitride source-material baseplate on its liquid-layer side can be made a nitrogen-atom surface. In addition, an element of at least one kind selected from the group consisting of elements constituting the III nitride single crystal can be included in the liquid layer.

In a further aspect, the present invention is a III nitride single crystal obtained according to the foregoing III nitride single-crystal manufacturing method.

In a still further aspect, the present invention is a semiconductor device that incorporates an above-recited III nitride single crystal.

Effects of the Invention

As set forth above, the present invention affords a III nitride single-crystal manufacturing method by which yields from the source materials are high and the crystal growth rate is advanced.

EXPLANATION OF REFERENCED NUMERALS

1: substrate; 1a: superficial layer; 1s, 2s: faces; 2: III nitride source-material baseplate; 3: liquid layer; 4: III nitride single crystal; 5: solid layer; 11: crystal growth chamber; 12: spacer; 13: interspace; 14: vacuum pump; 20: III nitride layer; 21: III nitride single-crystal substrate; 22: n-type GaN layer; 23: $In_{0.2}Ga_{0.8}N$ layer; 24: $Al_{0.2}Ga_{0.8}N$ layer; 25: p-type GaN layer; 31: n-side electrode; 32: p-side electrode; 40: semiconductor device; 45: emitted light.

BEST MODE FOR CARRYING OUT THE INVENTION

Figure 1A:
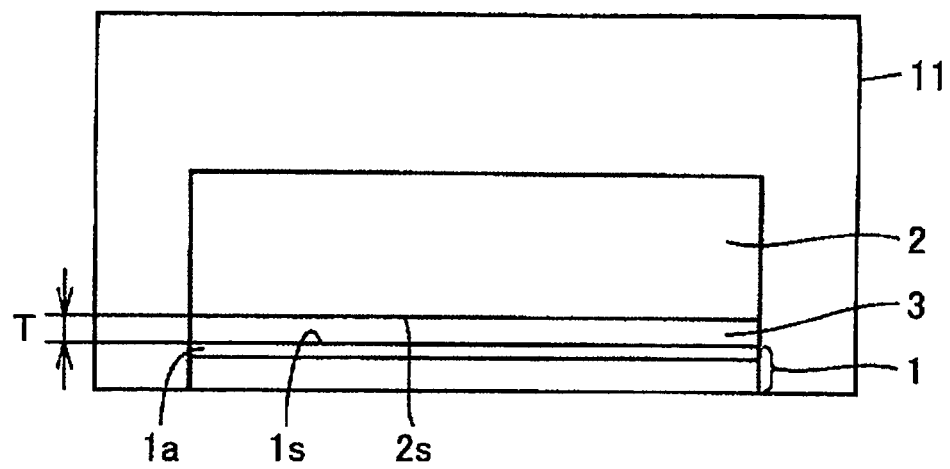
FIG. 1A is a schematic view for explaining a III nitride single-crystal manufacturing method involving the present invention.
Figure 1B:
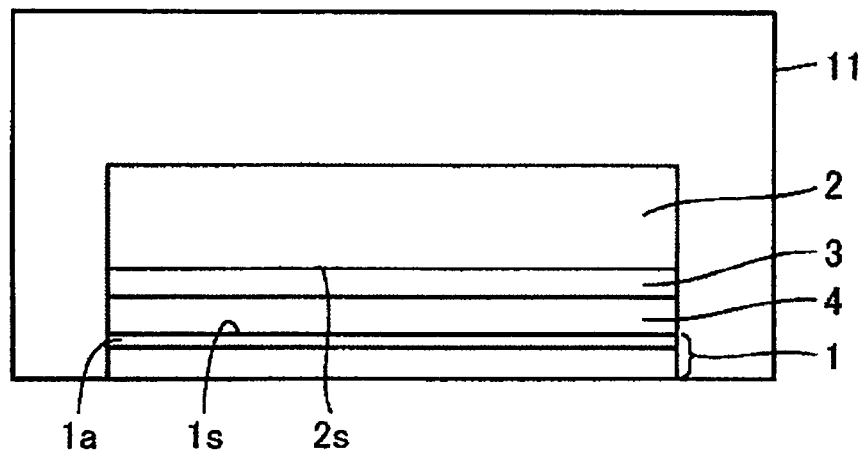
FIG. 1B is a schematic view for explaining a III nitride single-crystal manufacturing method involving the present invention.

With reference to FIG. 1, in a III nitride single-crystal manufacturing method involving the present invention, as indicated in FIG. 1A, a liquid layer 3 of 200 μm or less thickness is formed in between the substrate 1 and the III nitride source-material baseplate 2, and as indicated in FIG. 1B, III nitride single crystal 4 is grown onto the face 1s of the substrate 1 on its liquid-layer side.

By forming the liquid layer 3 in between the substrate 1 and the III nitride source-material baseplate 2, Group III elements and nitrogen elements within the III nitride source-material baseplate 2 dissolve out of the face 2s of the III nitride source-material baseplate 2 on its liquid-layer side and into the liquid layer 3, and are transported by the liquid layer 3 to the face 1s of the substrate 1 on its liquid-layer side, causing III nitride single crystal 4 to grow onto the substrate 1.

Therein, because the Group III elements and nitrogen elements are transported through the liquid layer, the source-material yield is enhanced. What is more, because the thickness of the liquid layer is an extremely thin 200 μm or less, the nitrogen transport is not the rate-determining step; rather, the growth speed is determined by the dissolving out of nitrogen from the III nitride source-material baseplate 2, on account of which the crystal-growth rate of the III nitride single crystal is heightened.

With reference to FIG. 1, in a method involving the present invention of manufacturing III nitride single crystal, it is preferable that the substrate 1 in at least a superficial layer 1a along the liquid layer be formed of a III nitride single crystal, and that the III nitride source-material baseplate 2 be formed of a III nitride polycrystal.

Forming the substrate 1 of a III nitride single crystal in at least a superficial layer 1a on the substrate's liquid-layer side, and growing the same type of a III nitride single crystal onto the face 1s of the substrate 1 on its liquid-layer side, yields large III nitride single crystal of favorable crystallinity. Furthermore, forming of a III nitride single crystal at least a liquid-layer-side, superficial layer 1a of the substrate 1, and forming of a III nitride polycrystal the III nitride source-material baseplate 2 makes the face 1s of the substrate 1 on its liquid layer side a III nitride single-crystal surface, and the face 2s of the III nitride source-material baseplate 2 on its liquid layer side a III nitride polycrystal. Thus, because the surface energy of the III nitride polycrystal surface is higher than that of the III nitride single-crystal surface, the transport of III nitride source material from the liquid-layer-ward face 2s of the III nitride source-material baseplate 2 to the liquid-layer-ward face 1s of the substrate 1 is promoted.

Again with reference to FIG. 1, in a III nitride single-crystal manufacturing method involving the present invention, it is further preferable that the superficial layer 1a of the substrate 1 along its liquid-layer side, and the III nitride source-material baseplate 2 be formed of a III nitride single crystal, and that the liquid-layer-ward face 1s of the substrate 1 be made a Group-III-atom surface, and the liquid-layer-ward face 2s of the III nitride source-material baseplate 2 be made a nitrogen-atom surface.

Inasmuch as rendering the liquid-layer-ward face 1s of the substrate 1a III-atom surface, and rendering the liquid-layer-ward face 2s of the III nitride source-material baseplate 2 the nitrogen-atom surface of a III nitride single crystal leads to surface energy that is higher in the nitrogen-atom surface than in the III-atom surface, the transport of III nitride source material from the liquid-layer-ward face 2s of the III nitride source-material baseplate 2 to the liquid-layer-ward face 1s of the substrate 1 is promoted.

Herein, a "III-atom surface" means the planar surface wherein the atoms of the Group-III element that forms the III nitride single crystal are arrayed in a single plane, which is equivalent to the (0001) crystallographic plane in a hexagonal III nitride single-crystal system, and to the (111) plane in a cubic III nitride single-crystal system. Likewise, a "nitrogen atom surface" means the planar surface wherein the nitrogen atoms that form the III nitride single crystal are arrayed in a single plane, which is equivalent to the (000$\bar{1}$) crystallographic plane in a hexagonal III nitride single-crystal system, and to the ($\bar{1}\bar{1}\bar{1}$) plane in a cubic III nitride single-crystal system.

Once again with reference to FIG. 1, in a III nitride single-crystal manufacturing method involving the present invention, the liquid layer 3 is not particularly limited as long as it promotes transport of III nitride source material, but preferably contains at least an element of a single kind selected from the group consisting of elements that form III nitride single crystal. Including at least an element of a single kind among elements that form III nitride single crystal makes for promoting the transport of the III nitride source material.

Specifically, in an implementation in which AlN single crystal is grown, the liquid layer preferably contains Al, alumina ($Al_2O_3$), a composite compound of a rare-earth oxide and alumina ($R_2O_3$-$Al_2O_3$, wherein R indicates a rare-earth element), or the like. Likewise, in an implementation in which GaN crystal is grown, the liquid layer preferably contains Ga or the like.

Furthermore, in an implementation in which $Al_xGa_{1-x}N$ (0<x<1) single crystal is grown, the liquid layer preferably contains Al and/or Ga, or the like.

Further in regard to the liquid layer 3, referring to FIG. 1, although there are no particular limitations on the method by which the layer, 200 μm or less in thickness, in between the substrate 1 and the III nitride source-material baseplate 2 is formed, from the perspective of ease of forming the liquid layer 3, the two methods below are preferably utilized.

The first method is as follows. First, with reference to FIG. 2A, a solid layer 5 of thickness $T_1$ that liquefies to become the liquid layer 3 is formed onto the face 2s of the III nitride source-material baseplate 2, and the III nitride source-material baseplate 2 on which the solid layer 5 has been formed is set onto the substrate 1, which has been placed within a crystal-growth chamber 11, such that the solid layer 5 contacts the face 1s of the substrate 1. Alternatively, a solid layer 5 of thickness $T_1$ that liquefies on the face 1s of the substrate 1 to become the liquid layer 3 is formed onto that face 1s, and the III nitride source-material baseplate 2 is set onto the solid layer 5. Herein, although there are no particular limitations on the technique by which the solid layer 5 of thickness $T_1$ is formed onto the III nitride source-material baseplate 2 or the substrate 1, from the perspective of ease of forming the solid layer 5, sputtering, vapor deposition, or a similar technique is preferably utilized.

Figure 2A:
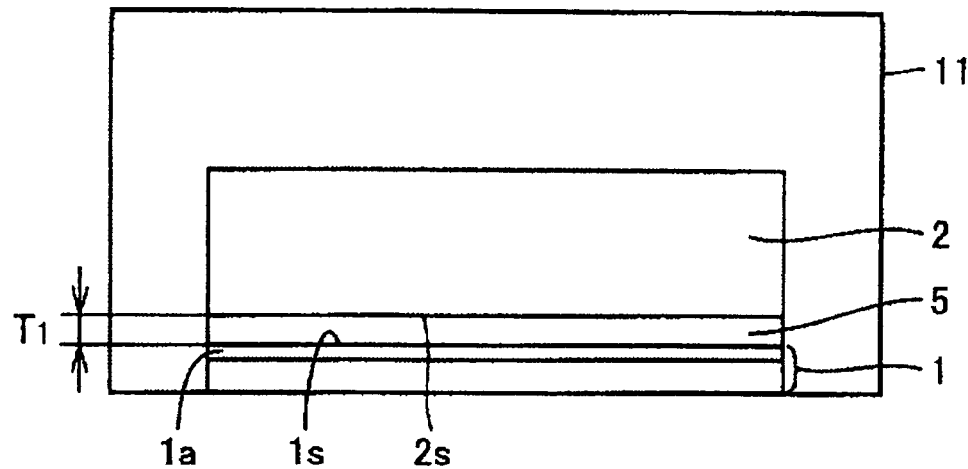
FIG. 2A is a schematic view for explaining one specific example of a III nitride single-crystal manufacturing method involving the present invention.
Figure 2B:
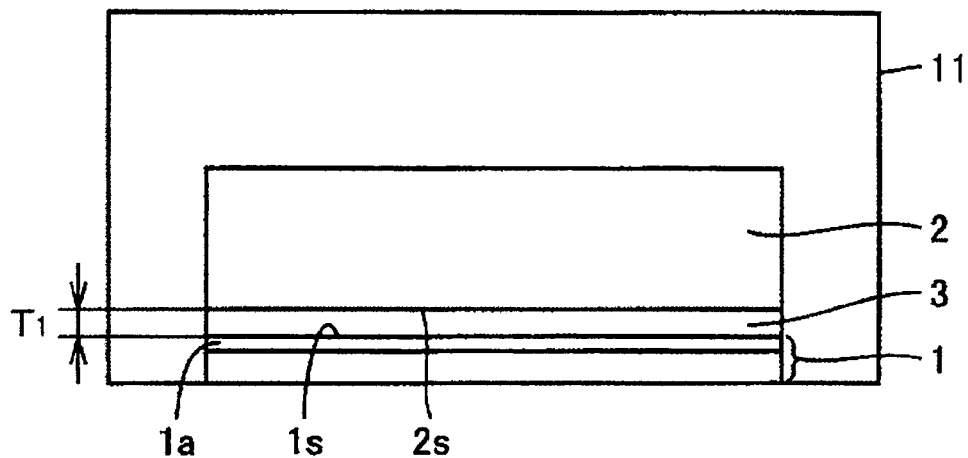
FIG. 2B is a schematic view for explaining the one specific example of a III nitride single-crystal manufacturing method involving the present invention.

Next, with reference to FIG. 2B, the crystal-growth chamber 11 is heated to liquefy the above-described solid layer 5, whereby a liquid layer 3 of thickness $T_1$ is formed in between the substrate 1 and the III nitride source-material baseplate 2. Then, with reference to FIG. 2C, the crystal-growth chamber 11 is maintained at a predetermined temperature (crystal-growth temperature) for a predetermined time period (crystal-growth time period), to enable III nitride single crystal 4 to be grown onto the liquid-layer-ward face $1s$ of the substrate 1.

This method is one that preferably is utilized with the thickness of the liquid layer being not greater than 50 μm, more preferably 30 μm or less. If the liquid-layer thickness exceeds 50 μm, the liquid layer 3 escapes from between the substrate 1 and the III nitride source-material baseplate 2, making it difficult to keep the thickness of the liquid layer 3 constant and making it difficult to control the growth speed of the III nitride single crystal.

The second method is as follows. First, referring to FIG. 3A, with spacers 12 of thickness $T_2$ interposing in, for example, four sites that evenly divide the peripheral top on a substrate 1 placed in the crystal-growth chamber 11, a III nitride source-material baseplate 2 is set atop the spacers 12, and a solid layer 5 that liquefies to become a liquid layer 3 is set atop the III nitride source-material baseplate 2. Accordingly, in this situation, an interspace 13 is formed in between the substrate 1 and the III nitride source-material baseplate 2, separating the two by $T_2$.

Here, in order to pump the crystal-growth chamber 11 interior down to a vacuum, a vacuum pump 14 is arranged on the crystal-growth chamber 11.

Figure 3A:
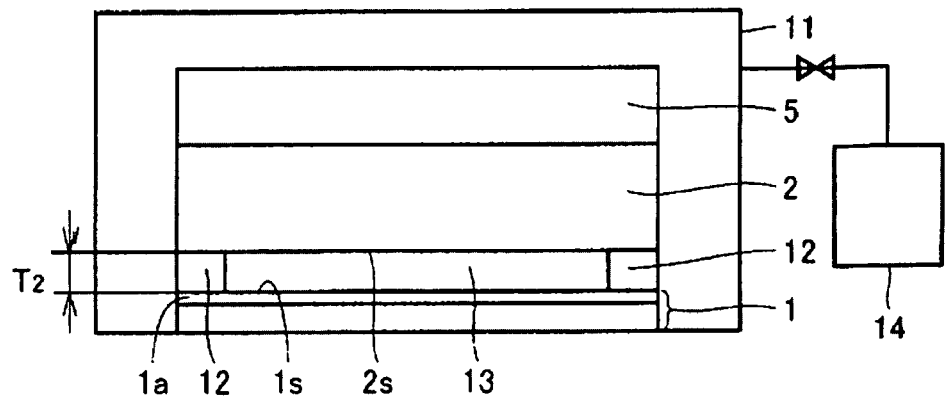
FIG. 3A is a schematic view for explaining a different specific example of a III nitride single-crystal manufacturing method involving the present invention.
Figure 3B:
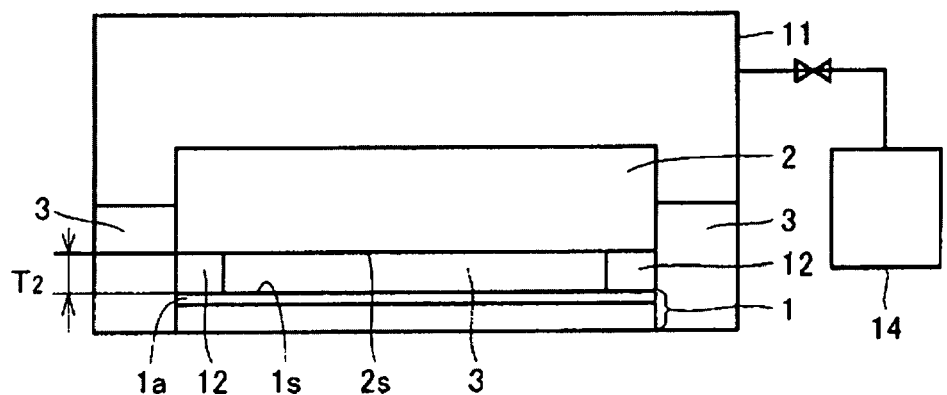
FIG. 3B is a schematic view for explaining the different specific example of a III nitride single-crystal manufacturing method involving the present invention.

Next, referring to FIG. 3B, the crystal-growth chamber 11 is heated and at the same time pumped down to a vacuum with the vacuum pump 14, whereby the solid layer 5 liquefies to form the liquid layer 3, and the liquid layer 3 spreads into every nook and cranny of the interspace 13, forming a liquid layer 3 of thickness $T_2$ in between the substrate 1 and the III nitride source-material baseplate 2. Then, with reference to FIG. 3C, the crystal-growth chamber 11 is maintained at a predetermined temperature (crystal-growth temperature) for a predetermined time period (crystal-growth time period), to enable III nitride single crystal 4 to be grown onto the liquid-layer-ward face $1s$ of the substrate 1.

Herein, as to the vacuum level in the crystal-growth chamber 11 interior, although not particularly limited as long as it is sufficient for the liquid layer 3 to spread throughout the interspace 13, the level can be put at for example 1 kPa (0.01 atm) or less.

Advantages to this method are that it enables a liquid layer whose thickness is 50 μm or more to be readily formed, and that it allows the thickness of the liquid layer to be freely determined according to the thickness of the spacers.

III nitride single crystal involving the present invention is obtained by means of an above-described method of manufacturing III nitride single crystal.

In turn, a semiconductor device involving the present invention is a device that incorporates an above-described III nitride single crystal. A III nitride single crystal described above is incorporated into a semiconductor device as, for example, a III nitride single-crystal substrate.

Figure 4:
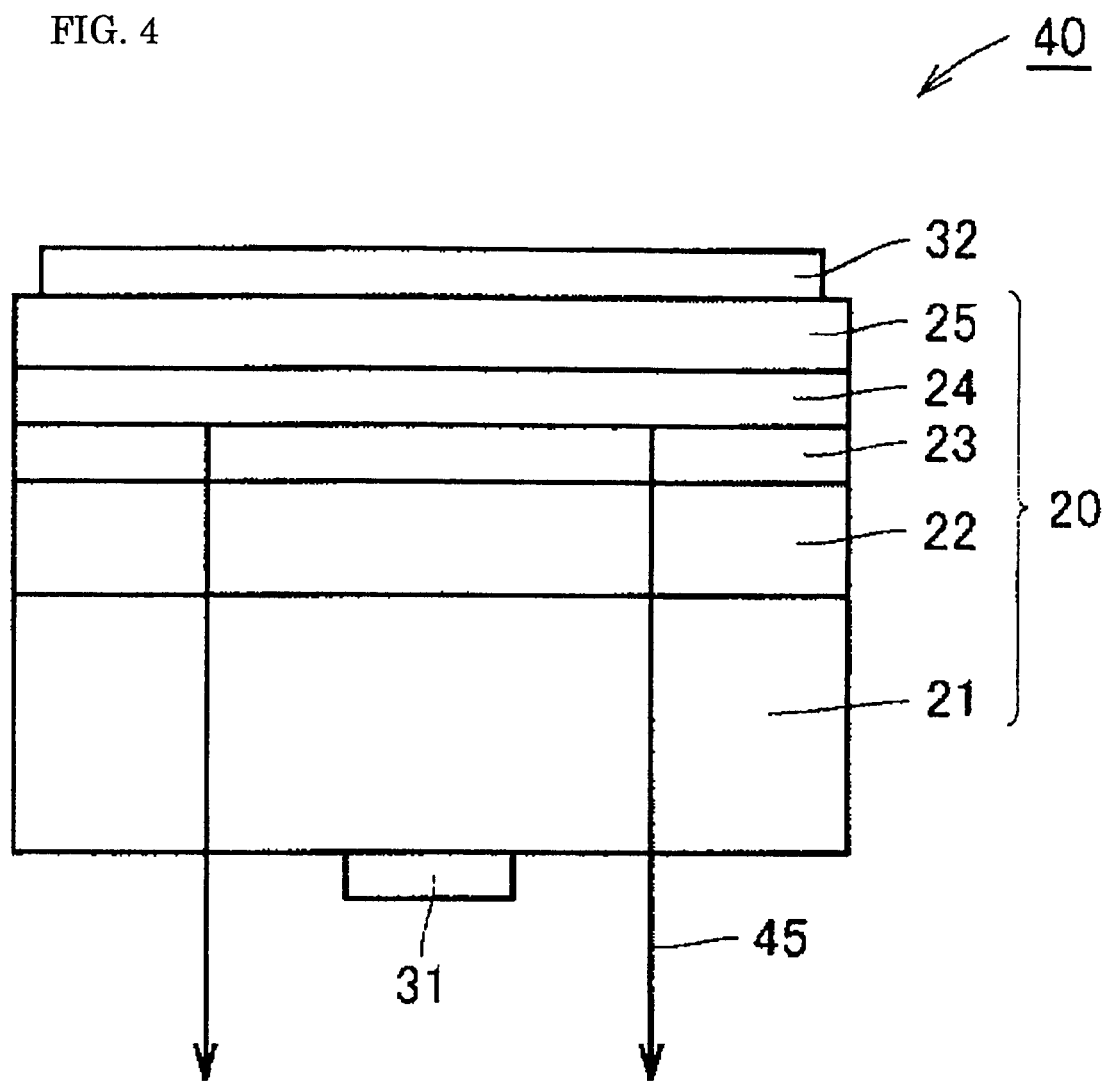
FIG. 4 is a schematic view for explaining one specific example of a semiconductor device involving the present invention.

For example, one semiconductor device involving the present invention is, referring to FIG. 4, a semiconductor device in which an n-type GaN layer 22, an $In_{0.2}Ga_{0.8}N$ layer 23, an $Al_{0.2}Ga_{0.8}N$ layer 24, and a p-type GaN layer 25 are formed in that order onto a III nitride single-crystal substrate 21, and an n-side electrode 31 is formed on the undersurface of the III nitride single-crystal substrate 21, and a p-side electrode 32 is formed on the top surface of the p-type GaN layer 25.

EMBODIMENTS

Embodiment 1

Initially, referring to FIG. 2A, a substrate 1 in which an AlN single-crystal layer 5 μm in thickness had been grown by MOCVD onto a 15-mm diameter sapphire plate, and, as a III nitride source-material baseplate 2, an AlN polycrystal substrate of 15 mm diameter×1 mm thickness were prepared. In this example, as the solid layer 5, an Al metal layer 10 μm in thickness was formed onto one of the sides of the III nitride source-material baseplate 2 by sputtering.

Subsequently, the III nitride source-material baseplate 2 on which the solid layer 5 had been formed was set onto the substrate 1, which had been placed in a crucible or similar crystal-growth chamber 11, so as to bring the solid layer 5 into contact with the AlN single-crystal layer on the substrate 1.

Next, referring to FIG. 2B, the crystal-growth chamber 11 was heated to liquefy the Al metal layer, i.e., the solid layer 5, whereby a molten Al layer, i.e., the liquid layer 3, of 10 μm thickness was formed in between the substrate 1 and the III nitride source-material baseplate 2.

Figure 2C:
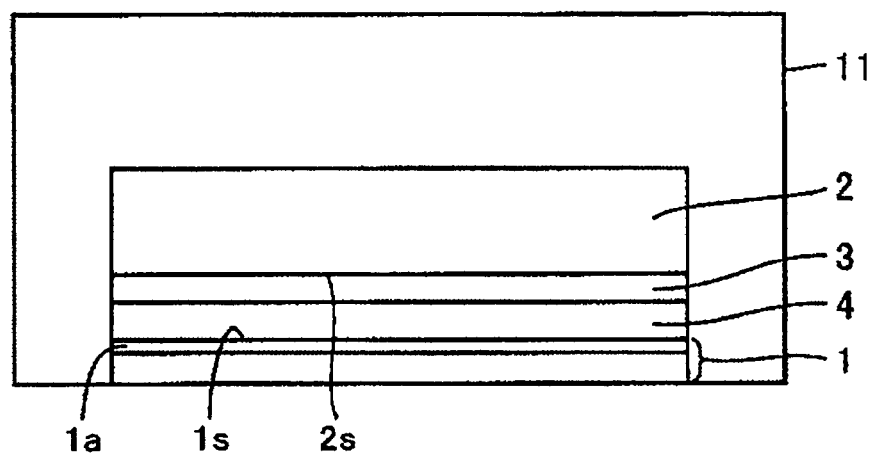
FIG. 2C is a schematic view for explaining the one specific example of a III nitride single-crystal manufacturing method involving the present invention.

Then, referring to FIG. 2C, the crystal-growth chamber 11 was heated to 1800° C. (crystal-growth temperature) and maintained there for 3 hours (crystal-growth time period), whereby AlN single crystal, i.e., III nitride single crystal 4, of 90 μm thickness was grown onto the liquid-layer-ward face $1s$ of the substrate 1. The crystal growth rate was 30 μm/h. It should be noted that single crystal from the embodiments in the present application was confirmed to be monocrystalline by X-ray diffraction analysis (XRD). The results are tabulated in the table.

Embodiment 2

Initially, referring to FIG. 3A, a substrate 1 in which an AlN single-crystal layer 5 μm in thickness had been grown by MOCVD onto a 15-mm diameter sapphire plate, and, as a III nitride source-material baseplate 2, an AlN polycrystal substrate of 15 mm diameter×1 mm thickness were prepared.

Subsequently, spacers 12 of 35 nm thickness were set in, for example, 4 sites that evenly divide the peripheral top on the substrate 1, which had been placed in the crystal-growth chamber 11, the III nitride source-material baseplate 2 was set atop the spacers 12, and Al metal as a solid layer 5 that liquefies into a liquid layer 3 was set atop the III nitride source-material baseplate 2. In this situation, an interspace 13 was formed in between the substrate 1 and the III nitride source-material baseplate 2, separating the two by 35 nm.

Next, the crystal-growth chamber 11 was heated to 1000° C. and at the same time pumped down to 1 kPa (0.01 atm) with the vacuum pump 14, whereby the Al metal, i.e., the solid layer 5, liquefied to form a liquid layer 3 of molten Al, and the liquid layer 3 spread into every nook and cranny of the interspace 13, forming a molten Al layer (liquid layer 3) of 35 nm thickness in between the substrate 1 and the III nitride source-material baseplate 2.

Figure 3C:
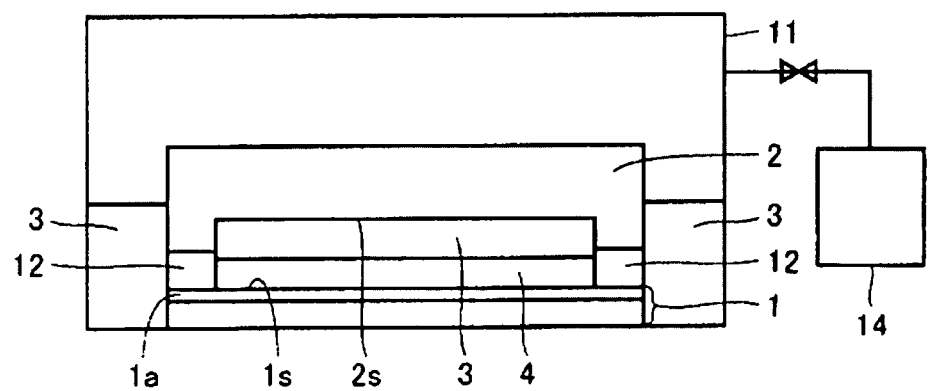
FIG. 3C is a schematic view for explaining the different specific example of a III nitride single-crystal manufacturing method involving the present invention.

Then, with reference to FIG. 3C, the crystal-growth chamber 11 was heated to 1800° C. and maintained there for 3 hours, whereby AlN single crystal, i.e., III nitride single crystal 4, of 27 μm thickness was grown onto the liquid-layerward face 1s of the substrate 1. The crystal growth rate was 9 µm/h. The results are tabulated in the table.

Embodiment 3

Utilizing as a substrate an AlN single-crystal plate of 15 mm diameter×500 µm thickness, AlN single crystal 16 µm in thickness was grown in a manner similar to that of Embodiment 2, except that the separation (equal to the thickness of the liquid layer—ditto in the following) between the substrate and III nitride source-material baseplate was made 150 µm, the crystal-growth temperature 2100° C., and the crystal-growth time period 4 hours. The crystal growth rate was 4 µm/h. The results are tabulated in the table.

Embodiment 4

Utilizing $Y_2O_3$-$Al_2O_3$ (mass ratio 40:60) as the material for the solid layer, and utilizing as a substrate an AlN single-crystal plate of 15 mm diameter×500 µm thickness, AlN crystal 36 µm in thickness was grown in a manner similar to that of Embodiment 1, except that the separation between the substrate and III nitride source-material baseplate was made 22 µm, and the crystal-growth time period 2 hours. The crystal growth rate was 18 µm/h. The results are tabulated in the table.

Embodiment 5

Utilizing $Gd_2O_3$-$Al_2O_3$ (mass ratio 15:85) as the material for the solid layer, and utilizing as a substrate an AlN single-crystal plate of 15 mm diameter×500 µm thickness, AlN crystal 10.5 µm in thickness was grown in a manner similar to that of Embodiment 1, except that the separation between the substrate and III nitride source-material baseplate was made 20 µm, and the crystal-growth time period 0.5 hours. The crystal growth rate was 21 µm/h. The results are tabulated in the table.

Embodiment 6

Utilizing $Sm_2O_3$-$Al_2O_3$ (mass ratio 55:45) as the material for the solid layer, and utilizing as a substrate an AlN single-crystal plate of 15 mm diameter×500 µm thickness, AlN crystal 10.5 µm in thickness was grown in a manner similar to that of Embodiment 1, except that the separation between the substrate and III nitride source-material baseplate was made 20 µm, and the crystal-growth time period 0.5 hours. The crystal growth rate was 21 µm/h. The results are tabulated in the table.

Embodiment 7

Utilizing $Sm_2O_3$-$Al_2O_3$ (mass ratio 55:45) as the material for the solid layer, and utilizing as a substrate an AlN single-crystal plate of 15 mm diameter×500 µm thickness, AlN crystal 9 µm in thickness was grown in a manner similar to that of Embodiment 2, except that the separation between the substrate and III nitride source-material baseplate was made 200 µm. The crystal growth rate was 3 µm/h. The results are tabulated in the table.

Embodiment 8

Initially, referring to FIG. 2A, a substrate 1 and, as a III nitride source-material baseplate 2, a hexagonal GaN single-crystal plate of 15 mm diameter×350 µm thickness were prepared, and an Na metal layer 10 µm in thickness was formed as a solid layer 5 onto the nitrogen-atom surface ((000$\overline{1}$) face) of the III nitride source-material baseplate 2 by sputtering. Subsequently, the III nitride source-material baseplate 2 on which the solid layer 5 had been formed was set onto the III-element surface ((0001) face) of the substrate 1, which had been placed in a crucible or similar crystal-growth chamber 11, so as to bring the solid layer 5 into contact with the III-element surface ((0001) face) of the substrate 1.

Next, referring to FIG. 2B, the crystal-growth chamber 11 was heated to liquefy the Na metal layer, i.e., the solid layer 5, whereby a molten Na layer, i.e., the liquid layer 3, of 10 µm thickness was formed in between the substrate 1 and the III nitride source-material baseplate 2.

Then, referring to FIG. 2C, the crystal-growth chamber 11 was heated to 800° C. and maintained there for 2 hours, whereby GaN single crystal, i.e., III nitride single crystal 4, of 30 µm thickness was grown onto the liquid-layer-ward face 1s (III-atom face, (0001) face) of the substrate 1. The crystal growth rate was 15 µm/h.

Embodiment 9

Initially, referring to FIG. 3A, a substrate 1 and, as a III nitride source-material baseplate 2, a hexagonal GaN single-crystal plate of 15 mm diameter×350 µm thickness were prepared. Subsequently, spacers 12 of 20 nm thickness were set in, for example, 4 sites that evenly divide the peripheral top of the Group III element atom surface (Ga face, (0001) face) of the substrate 1, which had been placed in the crystal-growth chamber 11, the III nitride source-material baseplate 2 was set atop the spacers 12 such that the nitrogen-atom surface (N face, (000$\overline{1}$) face) of the III nitride source-material baseplate 2 opposed the substrate 1 surface of Group III element atoms (Ga face, (0001) face), and Ga metal as a solid layer 5 that liquefies into a liquid layer 3 was set atop the III nitride source-material baseplate 2. In this situation, an interspace 13 was formed in between the substrate 1 and the III nitride source-material baseplate 2, separating the two by 20 nm.

Next, the crystal-growth chamber 11 was heated to 300° C. and at the same time pumped down to 1 kPa (0.01 atm) with the vacuum pump 14, whereby the Ga metal, i.e., the solid layer 5, liquefied to form a liquid layer 3 of molten Ga, and the liquid layer 3 spread into every nook and cranny of the interspace 13, forming a molten Ga layer (liquid layer 3) of 20 nm thickness in between the substrate 1 and the III nitride source-material baseplate 2.

Then, with reference to FIG. 3C, the crystal-growth chamber 11 was heated to 800° C. and maintained there for 6 hours, whereby GaN single crystal, i.e., III nitride single crystal 4, of 48 µm thickness was grown onto the liquid-layer-ward face 1s of the substrate 1. The crystal growth rate was 8 µm/h. The results are tabulated in the table.

Embodiment 10

Initially, referring to FIG. 2A, a substrate 1 in which an $Al_{0.2}Ga_{0.8}N$ single-crystal layer 2 µm in thickness had been grown by MOCVD onto a 15-mm diameter sapphire plate, and, as a III nitride source-material baseplate 2, a calcined $Al_{0.2}Ga_{0.8}N$ body (in which a mixture of GaN powder and AlN powder (at a 4:1 mole ratio) were calcined) of 15 mm diameter×1 mm thickness were prepared. In this example, as the solid layer 5, a layer 20 µm in thickness of a Na—Al—Ga metal alloy (at 5:2:3 mass ratios) was formed onto one of the sides of the substrate 1 by sputtering.

Next, referring to FIG. 2B, the crystal-growth chamber 11 was heated to liquefy the Na—Al—Ga metal alloy layer, i.e., the solid layer 5, whereby a molten Na—Al—Ga layer, i.e., a liquid layer 3, of 20 μm thickness was formed in between the substrate 1 and the III nitride source-material baseplate 2.

Then, referring to FIG. 2C, the crystal-growth chamber 11 was heated to 800° C. (crystal-growth temperature) and maintained there for 6 hours (crystal-growth time period), whereby AlN single crystal, i.e., III nitride single crystal 4, of 54 μm thickness was grown onto the liquid-layer-ward face 1s of the substrate 1. The crystal growth rate was 90 μm/h. The results are tabulated in the table.

COMPARATIVE EXAMPLE

AlN crystal was grown in a manner similar to that of Embodiment 1, except that the separation between the substrate and the III nitride source-material baseplate was made 300 μm, yet AlN crystal of 0.6 μm thickness was all that could be obtained, and the crystal-growth rate was a low 0.2 μm/h. The results are tabulated in the table.

GaN substrate when it was divided into chips, and a p-side electrode 32 of 100 nm thickness was formed on the top surface of the p-type GaN layer 25. Subsequently, the foregoing III nitride single-crystal lamina 20 was segmented into 400 μm×400 μm chips to form LEDs, i.e., semiconductor devices 40. The emission spectrum of the LEDs was measured with a spectroscope, wherein they had an emission spectrum whose peak wavelength was 450 nm.

The modes of embodying, and the embodiment examples disclosed in the present instance should be regarded in all respects as illustrative, not restrictive. The scope of the present invention is set forth by the scope of the patent claims, not the foregoing description, and is intended to include meanings equivalent to the scope of the patent claims, and all modifications within the scope.

The invention claimed is:

1. A III nitride single-crystal manufacturing method wherein a liquid layer of 200 μm or less thickness is formed in between a substrate and a III nitride source-material baseplate, and III nitride single crystal is grown onto the face of said substrate on its liquid-layer side.

TABLE

|  |  | Emb. 1 | Emb. 2 | Emb. 3 | Emb. 4 | Emb. 5 | Emb. 6 | Emb. 7 | Emb. 8 | Emb. 9 | Emb. 10 | Comp. Ex. 1 |
|---|---|---|---|---|---|---|---|---|---|---|---|---|
| Monocrystal growth conditions | Substrate | AlN/S | AlN/S | AlN | AlN | AlN | AlN | AlN | GaN | GaN | $Al_{0.2}Ga_{0.8}N$/S | AlN |
| | Source-mtrl. baseplate | p-AlN | p-AlN | p-AlN | p-AlN | p-AlN | p-AlN | p-AlN | GaN | GaN | GaN + AlN calcined body | p-AlN |
| | Liquid layer (composition & mass fraction) | Al (100) | Al (100) | Al (100) | $Y_2O_3$ (40) $Al_2O_3$ (60) | $Gd_2O_3$ (15) $Al_2O_3$ (85) | $Sm_2O_3$ (55) $Al_2O_3$ (45) | $Sm_2O_3$ (55) $Al_2O_3$ (45) | Na (100) | Ga (100) | Na (60) Al (20) Ga (30) | Al (100) |
| | Liquid layer formation | Spttrng. | Spttrng. | Spttrng. | Spttrng. | Spttrng. | Spttrng. | Spttrng. | Spttrng. | Spttrng. | Spttrng. | Spttrng. |
| | Liquid layer thickness (μm) | 10 | 35 | 150 | 22 | 20 | 20 | 200 | 10 | 20 | 20 | 300 |
| | Crystal-growth temperature (° C.) | 1800 | 1800 | 2100 | 1800 | 1800 | 1800 | 1800 | 800 | 800 | 800 | 1800 |
| | Crystal-growth time period (h) | 3 | 3 | 4 | 2 | 0.5 | 0.5 | 3 | 2 | 6 | 6 | 3 |
| Monocrystal | Monocrystal type | AlN | AlN | AlN | AlN | AlN | AlN | AlN | GaN | GaN | $Al_{0.2}Ga_{0.8}N$ | AlN |
| | Monocrystal thickness (μm) | 90 | 27 | 16 | 36 | 10.5 | 10.5 | 9 | 30 | 48 | 54 | 0.6 |
| | Crystal growth rate (μm/h) | 30 | 9 | 4 | 18 | 21 | 21 | 3 | 15 | 8 | 9 | 0.2 |

As is clear from the table, forming a liquid layer of 200 μm or less thickness in between the substrate and the III nitride source-material baseplate, and growing III nitride single crystal onto the surface of the substrate on its liquid-layer side enabled III nitride single crystal to be obtained at favorable yields and advanced crystal-growth rates.

Embodiment 11

An n-type GaN layer 22 of 5 μm thickness, an $In_{0.2}Ga_{0.8}N$ layer 23 of 3 nm thickness, an $Al_{0.2}Ga_{0.8}N$ layer 24 of 60 nm thickness, and a p-type GaN layer 25 of 150 nm thickness were deposited in that order by MOCVD onto a GaN single-crystal substrate (III nitride single-crystal substrate 21) obtained by polishing to a mirror-smooth finish the front surface of the 15-mm diameter×30-μm thickness GaN single crystal produced in Embodiment 8. Further, 80-μm diameter× 100-nm thickness n-side electrodes 31 were formed in positions that would become the middle of the undersurface of the 2. A III nitride single-crystal manufacturing method set forth in claim 1, wherein said substrate in at least a superficial layer along the liquid layer is formed of a III nitride single crystal, and said III nitride source-material baseplate is formed of a III nitride polycrystal.

3. A III nitride single-crystal manufacturing method set forth in claim 1, wherein said substrate in at least a superficial layer along the liquid layer, and said III nitride source-material baseplate are formed of a III nitride single crystal, and the face of said substrate on its liquid-layer side is a Group-III-atom surface; and the face of said III nitride source-material baseplate on its liquid-layer side is a nitrogen-atom surface.

4. A III nitride single-crystal manufacturing method set forth in claim 1, wherein said liquid layer includes element of at least one kind selected from the group consisting of elements constituting said III nitride single crystal.

* * * * *